(12) United States Patent
Yoshimoto et al.

(10) Patent No.: US 10,053,293 B2
(45) Date of Patent: Aug. 21, 2018

(54) ARTICLE TRANSPORT DEVICE AND ARTICLE TRANSPORT FACILITY INCLUDING SAME

(71) Applicant: Daifuku Co., Ltd., Osaka-shi (JP)

(72) Inventors: Tadahiro Yoshimoto, Gamo-gun (JP); Takeshi Abe, Higashiomi (JP); Kazuya Omori, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/433,049

(22) Filed: Feb. 15, 2017

(65) Prior Publication Data
US 2017/0233191 A1 Aug. 17, 2017

(30) Foreign Application Priority Data
Feb. 16, 2016 (JP) .................. 2016-027264

(51) Int. Cl.
| | |
|---|---|
| B65G 21/00 | (2006.01) |
| B65G 21/10 | (2006.01) |
| B65G 21/20 | (2006.01) |
| B65G 19/22 | (2006.01) |
| B65G 21/02 | (2006.01) |
| H01L 21/677 | (2006.01) |

(52) U.S. Cl.
CPC .......... *B65G 19/225* (2013.01); *B65G 21/02* (2013.01); *H01L 21/6773* (2013.01); *H01L 21/67733* (2013.01)

(58) Field of Classification Search
None
See application file for complete search history.

(56) References Cited

U.S. PATENT DOCUMENTS 4,869,877 A * 9/1989 Sellew ............... C05F 17/0235
422/111

FOREIGN PATENT DOCUMENTS

JP 2011157184 A 8/2011

* cited by examiner

*Primary Examiner* — Kavel Singh
(74) *Attorney, Agent, or Firm* — The Webb Law Firm

(57) ABSTRACT

An article transport device includes a transport mechanism which is configured to support, from below, a container being transported and to transport the container along a transporting path, and a housing which forms an accommodating space in which at least a part of the transport mechanism is housed. The housing has one or more support plates, a plurality of brackets, and a housing panel. Each of the one or more support plates is a plate-shaped member extending along the transporting path and is configured to support the transport mechanism from below. A lower end portion of each of the plurality of brackets is attached to a corresponding one of the one or more support plates such that the plurality of the brackets are spaced apart from one another along a direction along the transporting path, outside the accommodating space along the lateral width direction. When the housing panel is not attached to the at least one of the plurality of brackets, the housing is provided with a communicating opening for allowing communication between a space inside and a space outside the accommodating space. The vertical dimension of the communicating opening is set to be a dimension that corresponds to a vertical dimension of the at least one of the plurality of brackets.

12 Claims, 9 Drawing Sheets

ARTICLE TRANSPORT DEVICE AND ARTICLE TRANSPORT FACILITY INCLUDING SAME

CROSS-REFERENCE TO RELATED APPLICATION

This application claims priority to Japanese Patent Application No. 2016-027264 filed Feb. 16, 2016, the disclosure of which is hereby incorporated in its entirety by reference.

FIELD OF THE INVENTION

The present invention relates to an article transport device comprising a transport mechanism which is configured to support, from below, a container being transported and to transport the container along a transporting path, and a housing which forms an accommodating space in which at least a part of the transport mechanism is housed. The present invention also relates to an article transport facility including such an article transport device.

BACKGROUND

As an example of article transport devices described above, JP Publication of Application No. 2011-157184 (Patent Document 1) describes conveyors for carrying articles into and out of a stocker for storing articles.

As shown in FIG. 5 of Patent Document 1, the conveyors of Patent Document 1 have a housing in which frame members are located at four corners as seen along the transport direction with each frame member formed to be long such that its longitudinal direction is along the transport direction. While not described in detail in Patent Document 1, a known example of a conventional conveyor having such a housing is shown in FIGS. 10 and 11 of the present application. More specifically, the conveyor has a housing in which frame members 200Y are located at four corners of the housing as seen along the transport direction with each frame member 200Y formed to be long such that its longitudinal direction is along the transport direction and with a bottom plate 201, side plates 202, and a top surface plate 203 attached to the frame member 200Y. As shown in FIGS. 10 and 11, a travel carriage D which travels through an accommodating space inside the housing and along the transport direction is provided in the conveyor. And a support member 54 for supporting an article from below is provided at the upper end of the travel carriage D such that the support member 54 can be moved vertically. Further, an opening 200G is provided in the top surface of the housing through which the support member 54 can project upward beyond the opening 200G. When performing maintenance work on a transport mechanism in such a conveyor, the transport mechanism is often accessed through the opening formed in the top surface of the housing.

SUMMARY OF THE INVENTION

Incidentally, there are facilities in which rails that intersect the transporting path of the conveyor in plan view and travel members for transporting articles that travel along the rails are provided above the conveyor for the purpose of delivering and receiving articles to and from the conveyor. In such a facility, when performing maintenance work on the conveyor, a worker performs the work through the opening formed in the top surface of the housing. Thus, the traveling of the travel member needs to be suspended while the worker performs the maintenance work on the conveyor in order to prevent any interference between the worker and the travel member that travels along with the rails Thus, the operation efficiency of the facility may decline if the travel member is suspended during the maintenance work.

As a solution to problems such as one just described, it is conceivable to perform maintenance work on the conveyor not from the top surface of the housing of the conveyor but through its side surface. However, as described above, conveyors such as one described in Patent Document 1 have frame members that extend along the transport direction are spaced apart from each other along the vertical direction and at locations between the accommodating space and the space outside the housing. Thus, in order for a worker to be able to insert a hand into the accommodating space from a side of the housing to perform work on the transport mechanism etc., a communicating portion or opening of sufficient vertical dimension for a worker to insert the hand between the frame members spaced apart from each other vertically would be required. However, in order to form such a communicating portion or opening between the frame members spaced apart from each other vertically, the frame members spaced apart from each other vertically need to be spaced apart from each other by a large distance, which results in an increase in the vertical dimension of the housing.

On the other hand, it is sometimes required of conveyors such as one described in Patent Document 1 to have the housing having as small a vertical dimension as possible in order to allow for most efficient use of the vertical space of the facility in which the conveyor is installed. In such a case where the housing has frame members spaced apart from each other vertically as described above, if the housing is made to have a small vertical dimension, the communicating portion or opening cannot have sufficient vertical dimension, which makes it difficult to insert a hand into the accommodating space from a side of the housing when a worker performs maintenance work, and thus to perform the maintenance work from a side of the housing.

Thus, an article transport device is desired whose vertical dimension can be made small and which allows maintenance work to be performed properly from a side of a housing. And an article transport facility including such an article transport device is also desired.

An article transport device in accordance with the present invention for solving the problem described above comprises: a transport mechanism which is configured to support, from below, a container being transported and to transport the container along a transporting path; a housing which forms an accommodating space in which at least a part of the transport mechanism is housed; wherein the housing has one or more support plates, a plurality of brackets, and a housing panel, wherein each of the one or more support plates is a plate-shaped member with the one or more support plates arranged to extend along the transporting path and configured to support the transport mechanism from below, wherein, with a lateral width direction defined as a direction perpendicular to a direction along the transporting path as seen along a vertical direction, a lower end portion of each of the plurality of brackets is attached to a corresponding one of the one or more support plates such that the plurality of the brackets are spaced apart from one another along a direction along the transporting path, outside the accommodating space along the lateral width direction, wherein the housing panel is capable of being attached to and detached from at least one of the plurality of brackets, wherein, when the housing panel is not attached to the at least one of the plurality of brackets, the housing is provided with a communicating opening for allowing communication between a space inside and a space outside the accommodating space, and wherein a vertical dimension of the communicating opening is set to be a dimension that corresponds to a vertical dimension of the at least one of the plurality of brackets.

In other words, the housing has one or more support plates, a plurality of brackets, and a housing panel. And the one or more support plates (each of which is a plate-shaped member extending along the transporting path) are configured to support the transport mechanism from below. The bracket or brackets support a peripheral portion, especially the housing panel which forms at least a part of a side portion of the housing, other than the support plate which forms the bottom portion of the housing. Note that the one or more support plates in its entirety may be formed of a single flat plate portion, or may have a single through hole or multiple through holes that extend through the thickness of the one or more support plates.

Since a lower end portion of each of the plurality of brackets is attached to a corresponding one of the one or more support plates such that the plurality of the brackets are spaced apart from one another along a direction along the transporting path, at least one area is formed between the brackets located along the direction along the transporting path in which no bracket is located.

Therefore, by removing the housing panel which forms at least a part of a side portion of the housing from at least one of the brackets, a communicating opening that corresponds to the area in which no bracket is located is formed in the side portion of a housing. This communicating opening has a vertical dimension that corresponds to the vertical dimension of the at least one of the plurality of brackets and has a dimension along the direction along the transporting path that corresponds to the distance between the two adjacent brackets.

Therefore, when a worker performs maintenance work on the transport mechanism, the worker can insert a hand into the accommodating space through the communicating opening by removing the housing panel from the at least one of the brackets.

On the other hand, since the one or more support plates and the plurality of brackets serve as reinforcing members for the housing, the housing can be formed without the frame members that are long along the transporting path and spaced apart from each other vertically. Thus, even when a communicating opening with a sufficient vertical dimension for a worker to insert a hand through is formed, the vertical dimension of the housing can be kept from becoming large.

As such, with the arrangement described above, an article transport device can be provided whose vertical dimension can be made small and which allows maintenance work to be performed properly from its side.

DETAILED DESCRIPTION

Embodiments in which an article transport device and an article transport facility of the present invention are incorporated into a semiconductor fabrication factory are described next with reference to the attached drawings.

Figure 1:
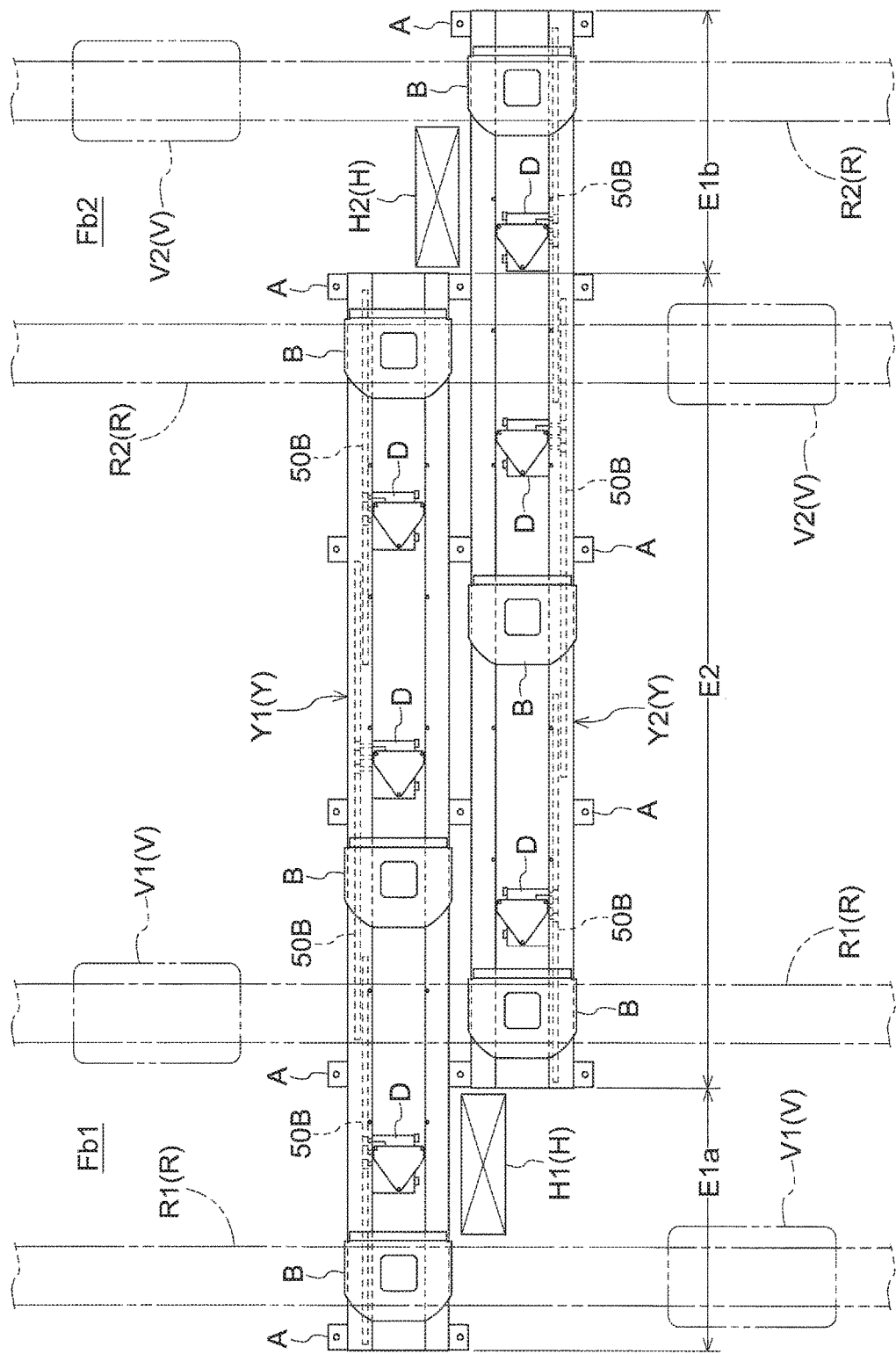
FIG. 1 is a plan view showing a portion of a semiconductor fabrication factory in which interareal conveyors are provided.
Figure 2:
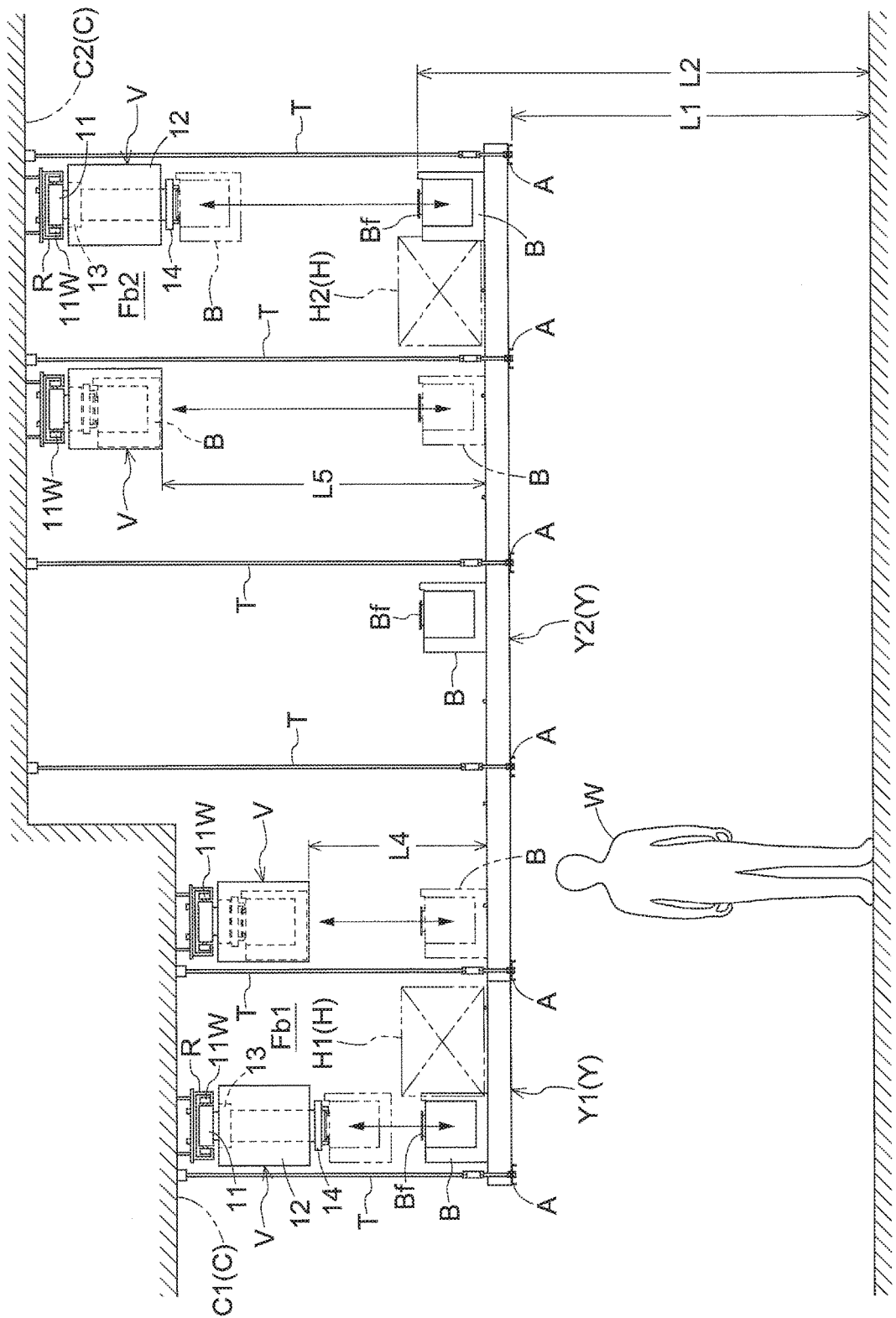
FIG. 2 is a side view showing the portion of the semiconductor fabrication factory in which interareal conveyors are provided.
Figure 3:
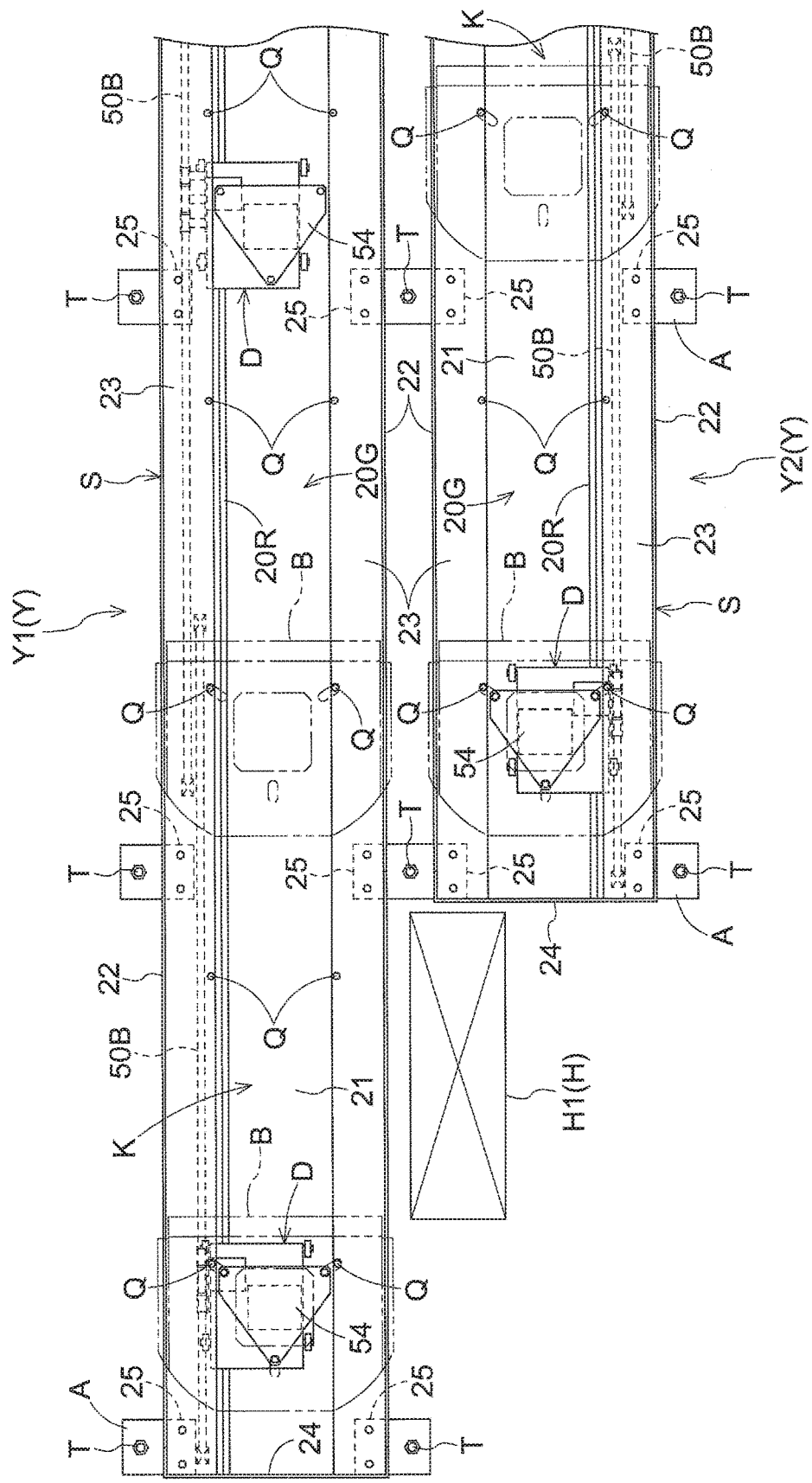
FIG. 3 is a plan view showing end portions, on one side along the transport direction, of the interareal conveyors.

As shown in FIGS. 1 and 2, the semiconductor fabrication factory of the present embodiment includes a ceiling or overhead transport facility including rails R which are suspended from the ceiling C and which extend along a travel path defined for each of a plurality of fabrication process areas (a first fabrication process area Fb1 and a second fabrication process area Fb2), and ceiling or ceiling transport vehicles V configured to travel along the rails R.

The rails R are installed to extend adjacent to, or by way of, processing devices to transport containers B (which are articles being transported and each of which is a container called a FOUP for transporting semiconductor substrates) between a plurality of processing devices. The rails R include (two pairs of) rails R1 that extend along the travel paths in the first fabrication process area Fb1, and (two pairs of) rails R2 that extend along the travel paths in the second fabrication process area Fb2. In addition, the ceiling transport vehicles V include ceiling transport vehicles V1 which can travel along the rails R1 and ceiling transport vehicles V2 which can travel along the rails R2.

As shown in FIG. 2, the ceiling C1 in the first fabrication process area Fb1 and the ceiling C2 in the second fabrication process area Fb2 are installed at different heights. And the rails R1 and the rails R2 are also installed at different heights. In the present embodiment, any of the pairs of rails R1 is not connected to any of the pairs the rails R2. Thus, a ceiling transport vehicle V1 cannot travel along the rails R2, and a ceiling transport vehicle V2 cannot travel along the rails R1. To address this issue, as shown in FIGS. 1-4, interareal conveyors Y for transferring containers B between ceiling transport vehicles V1 and ceiling transport vehicles V2 are provided. The interareal conveyors Y extend inclusively between an area below the two pairs of rails R1 and an area below the two pairs of rails R2. In the present embodiment, two interareal conveyors, namely, the first interareal conveyor Y1 and the second interareal conveyor Y2, are provided as interareal conveyors Y.

In the present embodiment, the first interareal conveyor Y1 is, or corresponds to, a first article transport device, and the second interareal conveyor Y2 is, or corresponds to, a second article transport device. In addition, as shown in FIGS. 1-5, the transporting path of the first interareal conveyor Y1 and the transporting path of the second interareal conveyor Y2 are arranged to be linear, parallel to each other, located at the same vertical height, and adjacent each other.

As shown in FIG. 2, each ceiling transport vehicle V has a travel portion 11 which has travel wheels 11W that roll on rails R and which travels along the rails R, a main body portion 12 which is suspended from and supported by the travel portion 11 to be located below the rails R, and a vertically movable member 14 which is suspended, by means of wires, from a vertical movement actuator 13 (which is supported by the main body portion 12) and which is vertically moved, or raised and lowered, by the actuating action of the vertical movement actuator 13. In addition, the grip portion, which can grip or hold a flange Bf provided at the upper end of a container B being transported, is provided at the lower end of the vertically movable member 14.

When transporting a container B, the ceiling transport vehicle V grips or holds the flange Bf with the grip portion, raises the vertically movable member 14, and causes the travel portion 11 to travel with the container B located in a transport purpose position at which the container B overlaps with the main body portion 12 as seen along the traveling direction of the ceiling transport vehicle V. In addition, as shown in FIG. 1, each of the transporting path of the first interareal conveyor Y1 and the transporting path of the second interareal conveyors Y2 has crossing portions each of which crosses rails R of the ceiling transport facility as seen along the vertical direction. When delivering and receiving a container B to or from an interareal conveyor Y described below in detail, the ceiling transport vehicle V causes the vertically movable member 14 to be vertically moved in a crossing portion of its travel path. In the present embodiment, an interareal conveyor Y is, or corresponds to, an article transport device whereas a ceiling transport vehicle V is, or corresponds to a travel member configured to travel along the rails R provided above the transporting path of an interareal conveyor Y. In addition, in the present embodiment, mainly the main body portion 12 is, or corresponds to, a "below-rail portion" which is located below the rails R. That is, in the present embodiment, an article transport facility is provided with (a) a ceiling or overhead transport facility including the ceiling or ceiling transport vehicles V and (b) interareal conveyors Y. In addition, the ceiling transport vehicle V has the main body portion 12 (below-rail portion) located below the rails R.

As shown in FIG. 1, the first interareal conveyor Y1 and the second interareal conveyor Y2 are displaced relative to each other along a direction along their transporting paths. In other words, the first interareal conveyor Y1 has an overlapping portion E2 and a non-overlapping portion E1a and the second interareal conveyor Y2 has an overlapping portion E2 and a non-overlapping portion E1b. That is, each of the first interareal conveyor Y1 and the second interareal conveyor Y2 has an overlapping portion (portion shown with E2 in FIG. 1), and a non-overlapping portion (portion shown with E1a or E1b in FIG. 1) along the direction along their transporting paths.

Next, the arrangement or the structure of the interareal conveyors Y is described. Although there are two interareal conveyors Y, namely, the first interareal conveyor Y1 and the second interareal conveyor Y2, the first interareal conveyor Y1 and the second interareal conveyor Y2 have the same structure; thus, one of the interareal conveyors Y (which can be either one of them) is described in the following description. As shown in FIGS. 3-6, each interareal conveyor Y has an accommodating space K in which the travel carriage D configured to transport a container B is accommodated and a housing S which forms or defines the accommodating space K by surrounding the accommodating space K.

Figure 4:
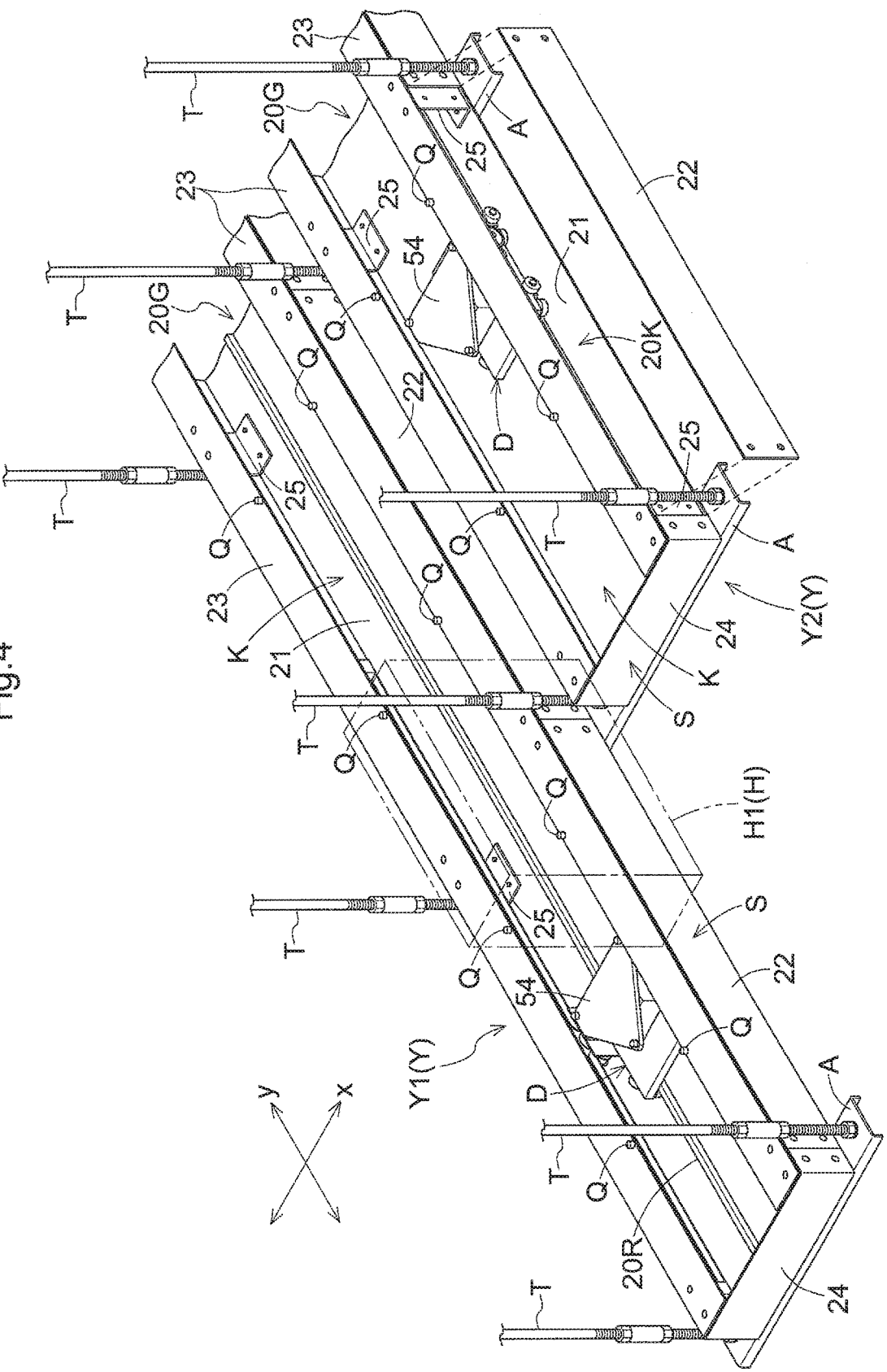
FIG. 4 is a perspective view showing end portions, on one side along the transport direction, of the interareal conveyors.
Figure 5:
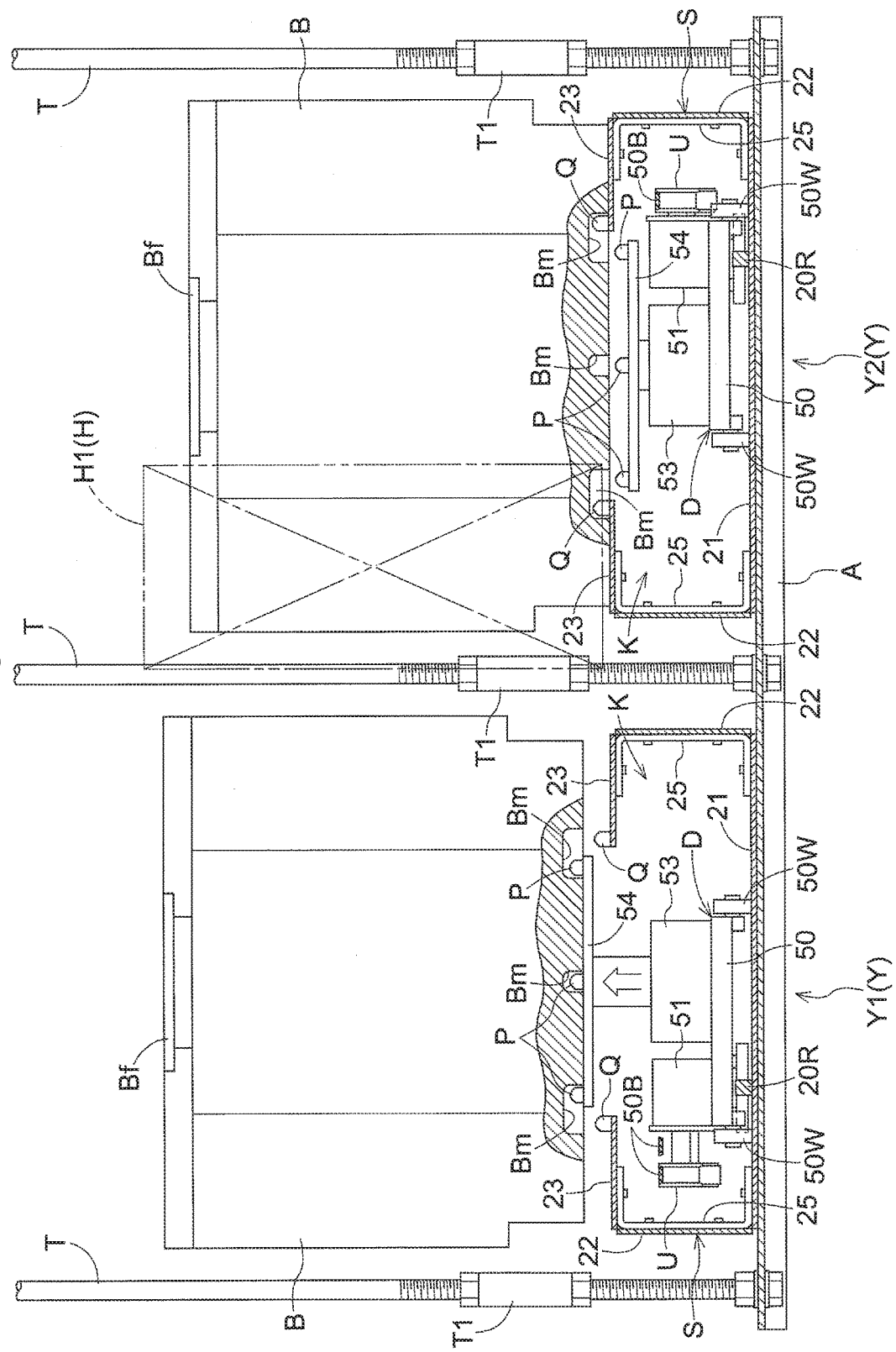
FIG. 5 is a frontal sectional view illustrating housings of interareal conveyors, and their interior structure.
Figure 6:
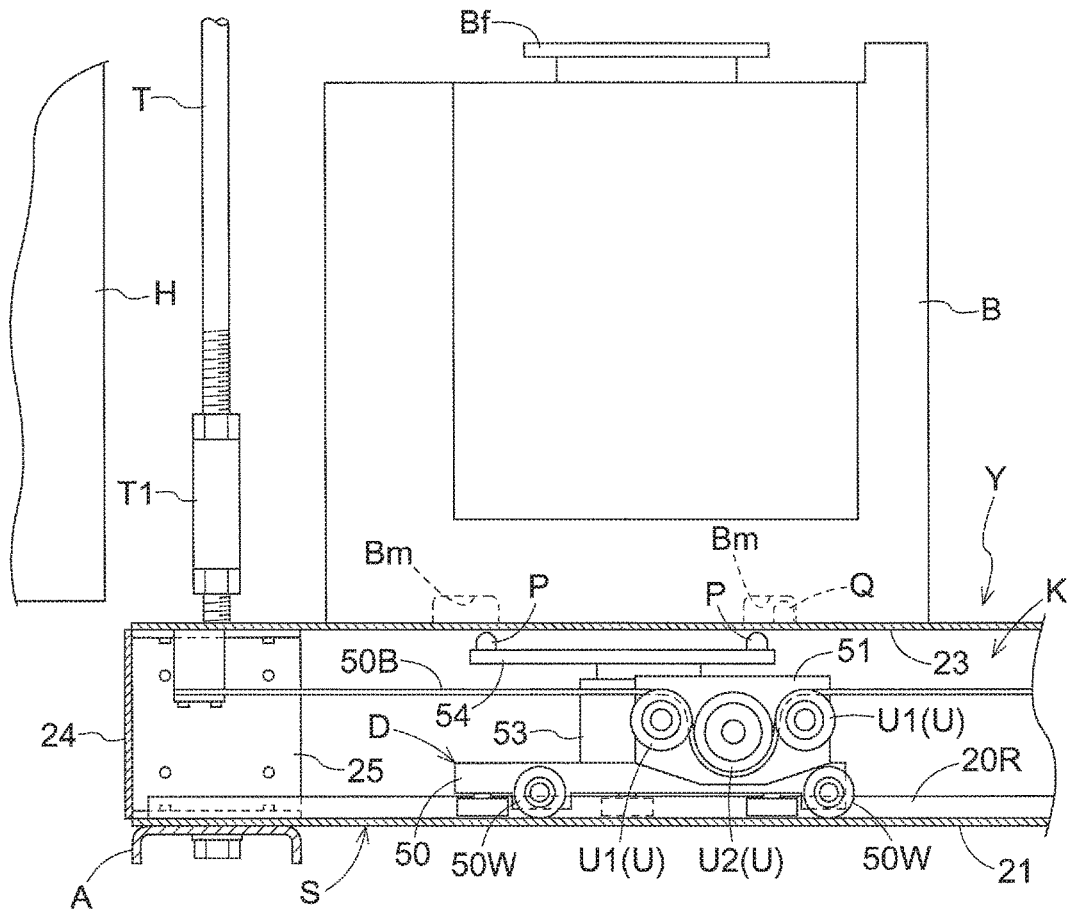
FIG. 6 is a side sectional view illustrating a housing of an interareal conveyor, and its interior structure.

As shown in FIGS. 4-6, the housing S has a support plate 21 which is located in the bottom portion of the housing S and which supports the travel carriage D etc., brackets 25 each of whose lower end portion is attached to the support plate 21, side plates 22 and top surface plates 23 which are attached to the brackets 25, and end portion closing members 24 each of which can be detachably attached to the brackets 25. Each end portion closing member 24 is configured such that it can be placed, by being attached to or detached from the brackets 25, in either an opening state for leaving open the end portion of the accommodating space K in the direction along a transporting path or a closing state for closing the end portion. Each side plate 22 is, or corresponds to, a housing panel. Each end portion closing member 24 is, or corresponds to, an end-portion-closing portion. The support plate 21 consists of a generally plate-shaped member that extends along the transporting path. Here, "plate-shaped" means a shape which is generally flat and whose thickness is less than its length and width. Note that the support plate 21 may be of one-piece structure that extends over the entire length along the transporting path of the interareal conveyor Y, or may be a number of pieces connected together to extend over the entire length of the interareal conveyor Y. In addition, the opening at each end portion of the accommodating space K defined by an end portion closing member 24 is so dimensioned that a travel carriage D described below can be moved through it.

Figure 8:
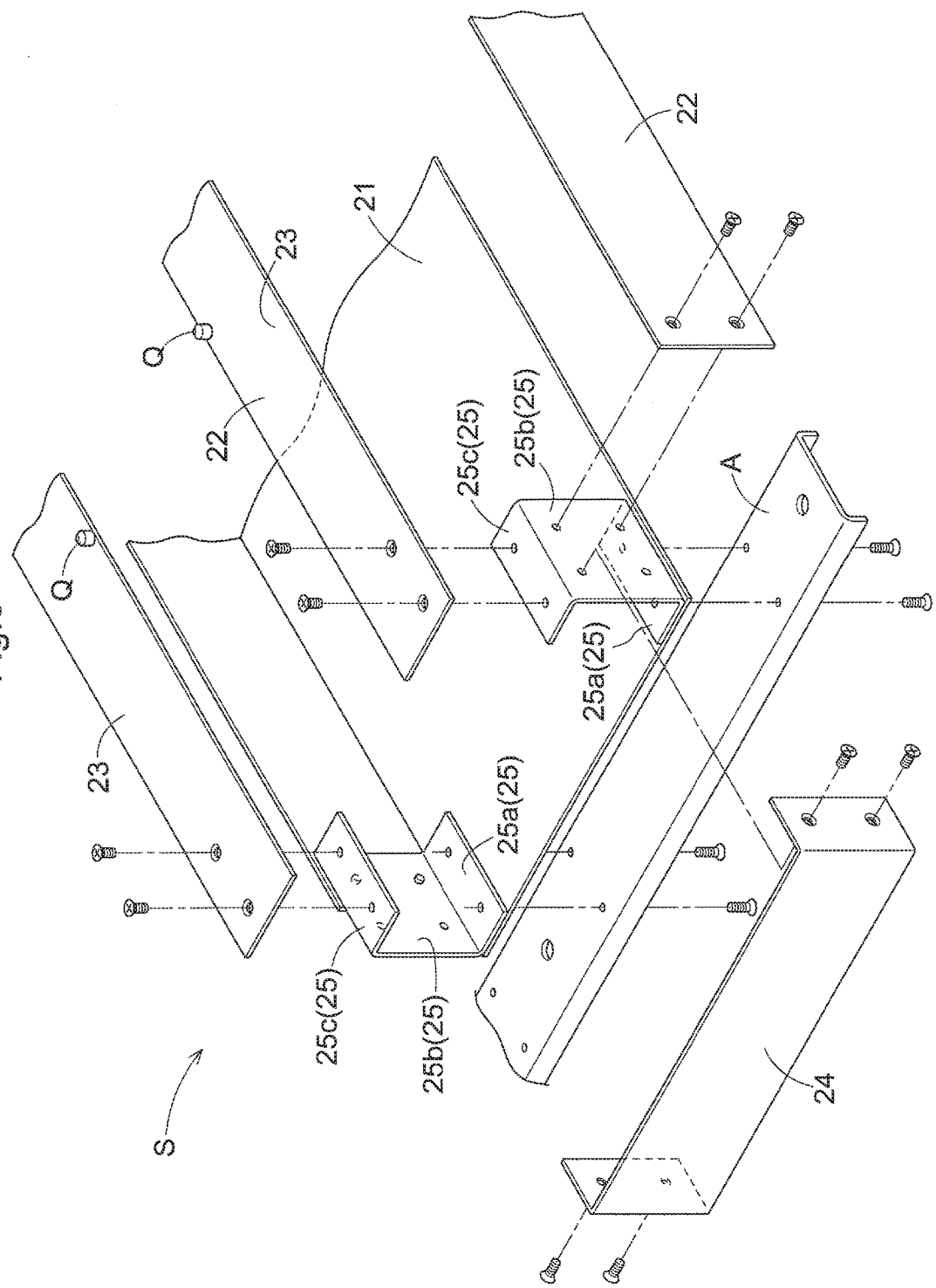
FIG. 8 is an exploded perspective view illustrating the structure of a housing.

As shown in FIG. 8, each bracket 25 has a second portion 25b which extends along the vertical direction as seen along a direction along the transporting path, a first portion 25a which extends from the lower end of the second portion 25b to one side along a horizontal direction, and a third portion 25c which extends from the upper end of the second portion 25b to the one side along the horizontal direction. Note that each bracket 25 in the present embodiment is formed by bending both end portions of one long metal plate in the same direction by 90 degrees so that the bent end portions form the first portion 25a and the third portion 25c respectively. Female screw or threaded holes for attaching the support plate 21 are formed in the first portion 25a. Similarly, female screw or threaded holes for attaching a side plate 22 are formed in the second portion 25b, and female screw or threaded holes for attaching the top surface plate 23 are formed in the third portion 25c.

As shown in FIG. 8, through holes are formed in the support plate 21 at positions that correspond to the locations of the female screw holes of the first portion 25a. And the bracket 25 is attached to the support plate 21 by placing male screws in threaded engagement with the female screw holes of the first portion 25a through these through holes.

Similarly, through holes are formed in the top surface plate 23 at positions that correspond to the locations of the female screw holes of the third portion 25c. And the top surface plate 23 is attached to the bracket 25 by placing male screws in threaded engagement with the female screw holes of the third portion 25c through these through holes.

As shown in FIGS. 3, 4, 5, 8, and 9, a pair of top surface plates 23 are provided such that they are spaced apart from each other along a lateral or right-and-left direction as seen along a direction along the transporting path. And an opening 20G is formed along the transporting path (see FIGS. 3 and 4) between the pair of right and left top surface plates 23.

As shown in FIG. 4, a direction that is perpendicular to the direction (y direction in FIG. 4) along the transporting path as seen along the vertical direction is defined as the lateral width direction (x direction in FIG. 4). And brackets 25 are arranged such that the first portion 25a of each bracket 25 is attached to the support plate 21 as shown in FIGS. 5 and 9, and such that a plurality of brackets 25 are spaced apart from one another along a direction along the transport direction, outside the accommodating space K along the lateral width direction as shown in FIG. 4.

Each side plate 22 which functions as a housing panel consists of a metal plate or a transparent acrylic plate, and has through holes formed in it at positions that correspond to the locations of the female screw holes formed in the second portion 25b of a bracket 25. And each side plate 22 is configured such that it can be attached to a bracket 25 by placing male screws in threaded engagement with the female screw holes of the second portion 25b through these through holes, and such that it can be detached from the bracket 25 by releasing the threaded engagement between the female screw holes of the second portion 25b and the male screws. Note that the arrangement for attaching a side plate 22 to a bracket 25 is not limited to the screw-threaded-hole engagement described above and may be done through a use of various kinds of known devices such as a magnet or a draw latch.

Thus, the interareal conveyor Y is configured such that side plates 22 which function as housing panels can be attached to and detached from respective or corresponding brackets 25.

Figure 9:
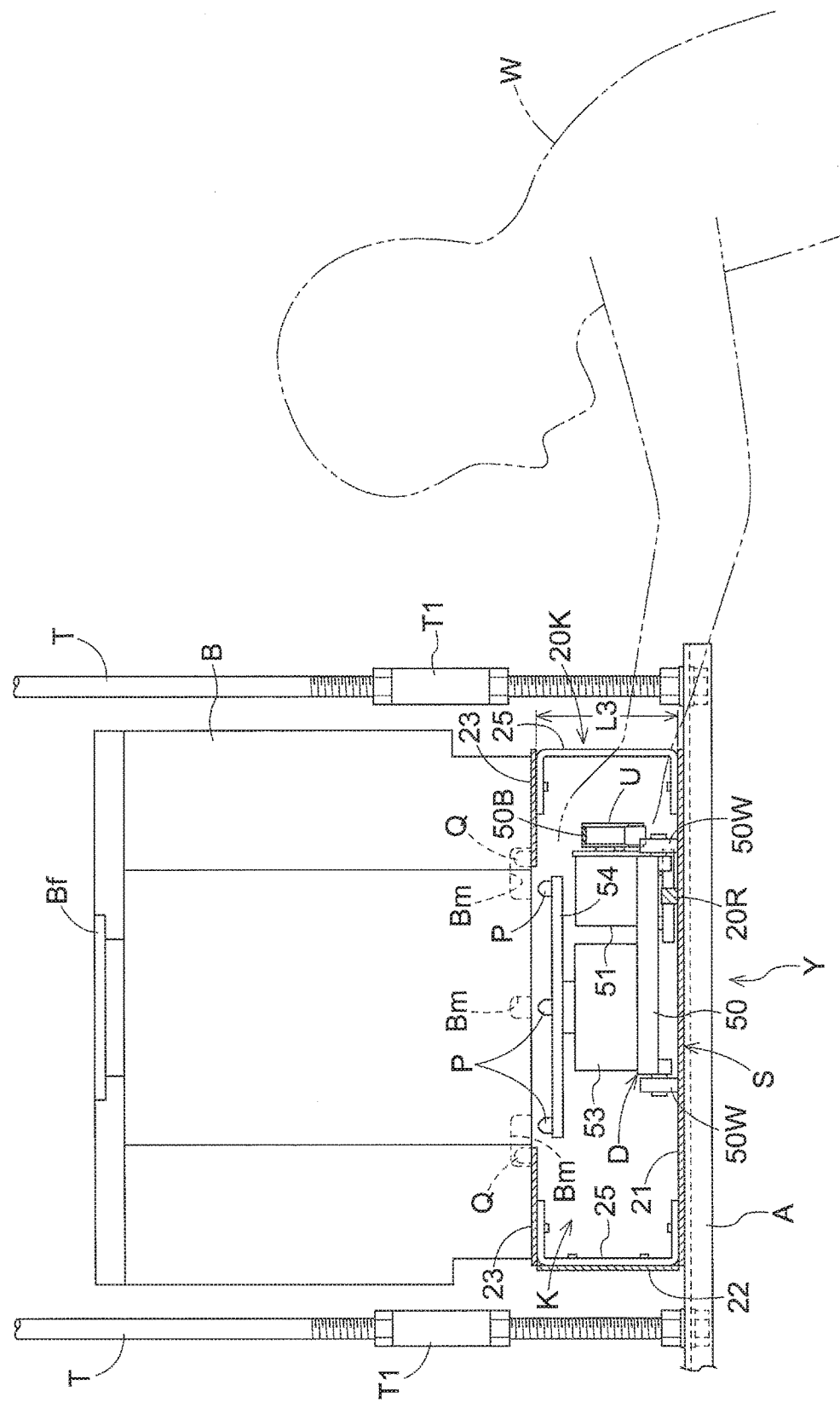
FIG. 9 is a drawing illustrating how maintenance work is performed by removing a side housing panel.
Figure 10:
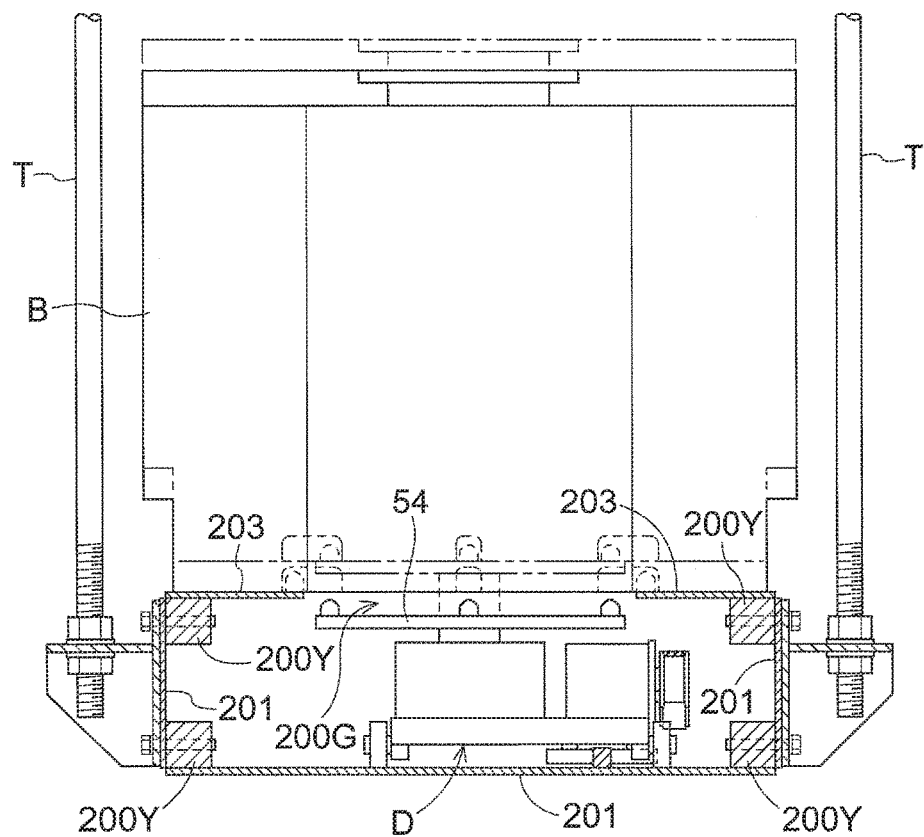
FIG. 10 is a sectional view showing a conventional interareal conveyor as seen along a transport direction.
Figure 11:
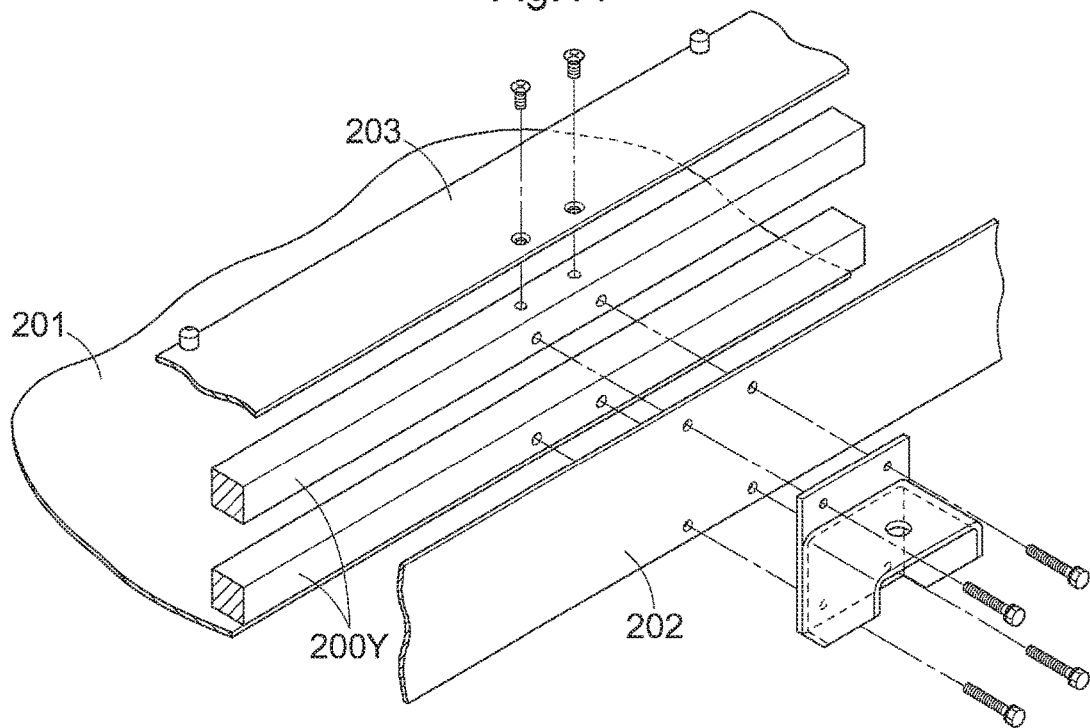
FIG. 11 is an exploded perspective view showing a part of a housing of the conventional interareal conveyor.

In addition, with a side plate 22 not attached to the brackets 25, a communicating opening 20K for allowing communication (i.e., for allowing passage of gas, matter, a hand etc.) between the space inside and the space outside the accommodating space K is formed in the housing S as shown in FIGS. 4 and 9.

Each side plate 22 is formed such that its vertical dimension corresponds to the length between the lower end and the upper end of the second portion 25b of the bracket 25. In addition, each side plate 22 is formed to have a dimension along the transporting path that corresponds to the sum of the lateral width of a bracket 25 and the distance between two adjoining brackets 25. The communicating opening 20K, in contrast to the dimension of the side plate 22, has a vertical dimension that corresponds to (or more specifically, identical to) the vertical dimension of the bracket 25 and has a dimension along the transport direction that corresponds to the distance between two adjacent brackets 25 (i.e., dimension that is equal to the distance from one bracket 25 to another bracket 25 that is adjacent in the transport direction).

In other words, with a side plate 22 not attached to the brackets 25, the housing S has, or is provided with, a communicating opening 20K for allowing communication (i.e., for allowing passage of gas, matter, a hand etc.) between the space inside and the space outside the accommodating space K. And the vertical dimension of the communicating opening 20K is set to be a dimension that corresponds to the vertical dimension of a bracket 25.

As shown in FIG. 6, a guide rail 20R for guiding the travel of the travel carriage D is attached to the upper end or surface of the support plate 21. The travel carriage D has a support member 54 for supporting a container B being transported from below, and a travel member 50 configured to travel through the accommodating space K integrally with the support member 54. In addition, a toothed belt 50B is supported below the top surface plate 23 in the accommodating space K such that the toothed belt 50B extends along the transport direction and is maintained under tension.

Figure 7:
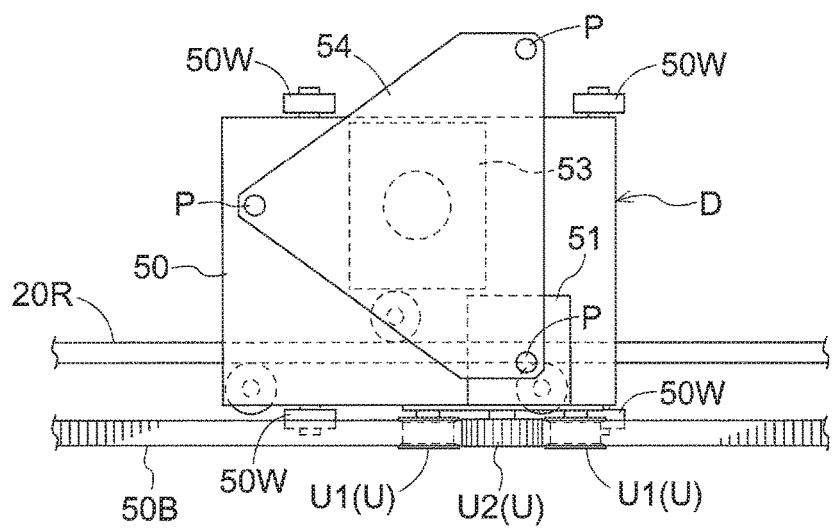
FIG. 7 is a plan view illustrating a structure of a carriage.

As shown in FIG. 7, the travel member 50 has idler wheels 50W as well as a toothed pulley U2. The idler wheels 50W can roll on the top surface of the support plate 21. And the toothed pulley U2 meshes with the toothed belt 50B located to one side of the travel member 50 as seen along a direction along the transport direction. The toothed pulley U2 is configured to be actuated by a travel drive motor 51, and travels along the direction along which the toothed belt 50B (that the pulley 12 meshes with) extends, as the travel drive motor 51 rotates. Tension pulleys U1 for increasing the amount of contact of the toothed belt 50B against the toothed pulley U2 are provided on both sides of the toothed pulley U2 along a direction along the transporting path. Note that the toothed pulley U2, the tension pulleys U1, and the toothed belt 50B of the first interareal conveyor Y1 are located on the side opposite or away from the second interareal conveyor Y2 whereas those of the second interareal conveyor Y2 are located on the side opposite or away from the first interareal conveyor Y1, along the direction along which the first interareal conveyor Y1 and the second interareal conveyor Y2 are spaced apart from each other.

As shown in FIGS. 6 and 9, positioning pins P for engaging positioning grooves Bm formed in the lower end of the container B are provided in the upper end of the support member 54. In addition, positioning pins Q for engaging the positioning grooves Bm formed in the lower end of the container B are provided to the top surface plates 23. Note that the positioning pins Q on the top surface plates 23 are distributed over a plurality of locations along the transporting path. These plurality of locations are locations for temporarily storing containers B to provide a buffer for the containers B.

A cylinder mechanism 53 for vertically moving the support member 54 is mounted in the travel member 50. And the support member 54 is so dimensioned that it can pass or be moved upward and downward through the opening 20G between the top surface plates 23. The support member 54 can be moved by the operation of the cylinder mechanism 53 between a lowered position at which the upper ends of positioning pins P are at a lower height than the upper end of the top surface plates 23, and a raised position at which the upper end of the support member 54 is at a higher position than the positioning pins Q of the top surface plates 23. After having moved to below the container B supported by the top surface plates 23 with the support member 54 switched to, and placed at, the lowered position by the operation of the cylinder mechanism 53, the travel carriage D moves the container B out of engagement with the positioning pins Q by switching or moving the support member 54 to its raised position by the operation of the cylinder mechanism 53. And the container B is transported along the travel path by causing the travel member 50 to travel with the container B in that state. These operations are reversed when unloading the container B onto the top surface plates 23.

The work procedure for taking such a travel carriage D out the housing S for maintenance work is described next. A worker W removes a side plate 22 from the brackets 25 of the housing S to form a communicating opening 20K in a side surface of the housing S, inserts a hand into the accommodating space K through the communicating opening 20K, and removes the toothed belt 50B from the toothed pulley U2 and the tension pulleys U1. Alternatively, the worker W can remove an end portion closing member 24 from the brackets 25 of the housing S to open the end of the accommodating space K so that the travel carriage D can be taken out through the opening at the end portion of the accommodating space K.

In the present embodiment, the travel carriage D and the toothed belt 50B form, or correspond to, the transport mechanism. That is, the interareal conveyor Y includes a transport mechanism which is configured to support, from below, a container B being transported and is configured to transport the container B along the transporting path. The transport mechanism has a support member 54 which is configured to support, from below, the container B being transported and is configured to be moved along the transporting path, and a travel member 50 configured to travel along the transporting path and through the accommodating space K. The support plate 21 supports the transport mechanism from below.

In addition, the interareal conveyor Y is configured such that a part or all of (i.e., at least a part of) the support member 54 can project upward through the opening 20G. The housing S of the interareal conveyor Y is configured to form the accommodating space K in which a part or all of (i.e., at least a part of) the transport mechanism is housed or accommodated.

The interareal conveyor Y is further provided with casings H in each of which a controller is housed which controls the travel drive motor 51 in the travel carriage D and the cylinder mechanism 53, etc. (see FIGS. 1, 2, 3, 5, and 6).

The casings H include a first casing H1 which houses a controller for the first interareal conveyor Y1, and a second casing H2 which houses a controller for the second interareal conveyor Y2.

As shown in FIG. 1, each of the first casing H1 and the second casing H2 is located within the range, along the transporting path, in which the corresponding housing S extends and to one side of the housing S along the lateral width direction. In addition, as shown in FIG. 2, each of the first casing H1 and the second casing H2 is located at a higher position along the vertical direction than the housing S. In other words, the casing H is located within the range, along the transporting path, in which the corresponding housing S extends and to one side of the housing S along the lateral width direction and at a position at which the casing H does not overlap with the housing S as seen along the lateral width direction. In addition, with regard to how each casing H is installed, any of various conventional method may be used, such as supporting the casing H by suspending it from the ceiling or by means of support members that stand on the floor.

Further, as shown in FIG. 1, the first casing H1 is located in a range along the transporting path in which the non-overlapping portion E1a for the first interareal conveyor Y1 extends whereas the second casing H2 is located in a range along the transporting path in which the non-overlapping portion E1b for the second interareal conveyor Y2 extends.

With such an arrangement, interareal conveyors Y can be provided in which each casing H can be located to a side and close to the housing S in plan view and proper maintenance work can be performed on the transport mechanisms from the side.

In the present embodiment, the interareal conveyors Y are suspended from the ceiling C and are thus supported in this manner. How the interareal conveyors Y are supported in present embodiment is described next. Housing support portions A for supporting from below the support plate 21 which forms the bottom portion of the housing S are suspended and supported by suspension bolts T that are in turn suspended from the ceiling C. Each housing support portion A is formed to be longer than the range or extent in which the housing S extends along the lateral width direction. And the suspension bolts T are connected to the housing support portion A at positions along the lateral width direction which do not overlap with the area of the housing S. Both the right and left end portions of each housing support portion A as seen along its longitudinal direction are bent downward. These bent portions serve as reinforcing ribs to increase strength of the housing support portion A along the longitudinal direction. In addition, an adjusting portion T1 for finely adjusting the height of the lower end of the suspension bolt T is provided in each suspension bolt T.

That is, the support plate 21 is supported from below by the housing support portions A each of which has an elongate shape. Each housing support portion A is oriented such that its longitudinal direction is along the lateral width direction (x direction of FIG. 4). And a plurality of housing support portions A are located in spaced-apart relation at positions that correspond to the positions of the brackets 25 along a direction along the transporting path.

The vertical positional relationship between the ceiling transport vehicles V and interareal conveyors Y is described next.

As shown in FIG. 2, the rails R are so located along the vertical direction that, in each crossing portion, the distance between an lower end of the trajectory of the below-rail portion of the ceiling transport vehicle V that travels along the rails R and an upper end of the corresponding interareal conveyor Y is less than or equal to a set distance (L4 and L5 in FIG. 2). And the allowable vertical dimension of the housing S of each interareal conveyor Y is determined based on the height of the lower end of the trajectory of the ceiling transport vehicle V, the vertical dimension of the container B being transported, and the height of the lower limit for installing the interareal conveyors Y.

In other words, as shown in FIG. 2, when, for example, a workspace for workers W exists below the interareal conveyors Y, the lower ends of the interareal conveyors Y (the lower ends of the housing support portions A described in detail below) need to be located at a higher position than a height defined based on the heights of the workers W. Therefore, this determines the height L1 (from a floor surface) of the lower limit for installing the interareal conveyors Y (referred to as the conveyor lower limit height L1). In addition, a container upper limit height L2 is determined which is the allowable height of the upper end of the containers B supported by the interareal conveyors Y such that any collision between the ceiling transport vehicles V and containers B which the interareal conveyors Y are transporting can be avoided. Note that, for safety reasons, a space having a preset vertical dimension is additionally provided between the container upper limit height L2 and the lower end of the trajectory of the ceiling transport vehicle V.

Because of these considerations and limitations, the vertical dimension of the housing S is determined by the conveyor lower limit height L1 and the container upper limit height L2. When the height from the floor surface to the ceiling needs to be as small as possible for effective use of available space, the height of the lower end of the space through which the ceiling transport vehicle V travels needs to be lowered; thus, the container upper limit height L2 needs to be lowered. In such a case, it would be necessary to make the vertical dimension of the housing S as small as possible; however, the interareal conveyors Y can be such that it is easy to perform maintenance work on them from the sides while making their vertically dimension as small as possible by utilizing the housing S as described in the present embodiment.

Alternative Embodiments (1) In the embodiment described above, an embodiment is described in which the article transport device of the present invention is applied to an interareal conveyor Y for transferring containers B between ceiling transport vehicles V in two fabrication process areas Fb. However, the invention is not limited to such an application. For example, the article transport device of the present invention may be applied to a conveyor for carrying containers B into and out of the stocker for storing the containers B. In such a case, one side end portion of the conveyor is located outside the stocker to provide an article transfer location at the end portion for transferring containers B to or from the ceiling transport vehicles V. And the other end portion of the conveyor is located inside the stocker to provide an article transfer location at the other end portion for transferring containers to or from a transport device (stacker crane etc.) within the stocker.

(2) In the embodiment described above, an example is described in which each transport mechanism has a travel carriage D which can travel along a transporting path. However, the invention is not limited to such an arrangement. For example, each transport mechanism may consist of a roller conveyor having a plurality of transporting rollers arranged one next to another along a transporting path. In this case, the transporting rollers may be paired such that a roller in a pair is spaced apart from the other roller in the pair along the lateral width direction as seen along a direction along the transporting path. Also in this case, some or all of the transporting rollers project further upward than the top surface plates 23 through the opening 20G.

(3) In the embodiment described above, an example is described in which each article being transported is a container B (FOUP) for transporting semiconductor substrates. However, each article being transported may be a container other than a FOUP (for example, FOSB) or a container for transporting reticles.

Also in the embodiment described above, an example is described in which an article transport device and an article transport facility of the present invention are applied to a semiconductor fabrication factory. However, an article transport device and an article transport facility of the present invention may be applied to any kind of facilities, such as, a food-processing factory or a machine manufacturing factory, etc. In this case, naturally, articles being transported are the processed objects and/or manufactured or fabricated objects that are subjected to the operations in the facility.

(4) In the embodiment described above, an example is described in which the brackets 25 are formed by bending metal plates or sheets. However, the invention is not limited to such an arrangement. The brackets 25 may be formed using various conventional methods. For example, the first portion 25a, the second portion 25b, and the third portion 25c may be formed as separate elements which are then joined together by welding, or may be integrally formed by casting. In addition, various kinds of material other than metal such as fiber reinforced plastic or ceramic material may be used as the material for the brackets 25.

(5) In the embodiment described above, an example is described in which the housing support portions A are suspended from and thus supported by the ceiling C by means of the suspension bolts T. However, the housing support portions A may be supported by means of support columns that extend from a floor surface or may be supported by a wall surface in a cantilever fashion (supported only at one side).

(6) In the embodiment described above, an example is described in which the side plates 22 and the end portion closing members 24 can be attached and detached e.g, to and from the end portions along the transporting path of the housing S. However, these members are not limited to such an arrangement. For example, each side plate 22 and each end portion closing member 24 may be configured to be a door which can be opened and closed about one or more hinges. In such as case, the hinges may be located at or near a top edge or bottom edge of the side plate 22 or the end portion closing member 24.

(7) In the embodiment described above, the casings H are arranged to be located at a higher position than the housing S along the vertical direction. However, the casings H may be arranged to be located at a lower position than the housing S along the vertical direction. In addition, the casings H may be located such that they overlap with the respective housings S as seen along the lateral width direction.

(8) In the embodiment described above, the first interareal conveyor Y1 and the second interareal conveyor Y2 are provided as interareal conveyors Y. However, only one interareal conveyor Y may be provided. In addition, when the first interareal conveyor Y1 and the second interareal conveyor Y2 are provided as interareal conveyors Y, the casings H include a first casing H1 which houses the controller for the first interareal conveyor Y1, and a second casing H2 which houses the controller for the second interareal conveyor Y2. However, the controller for the first interareal conveyor Y1 and the controller for the second interareal conveyor Y2 may be housed in the same casing H. Even in this case, the casing H may be located to one side of the housing S and at a position at which the casing H does not overlap with the housing S as seen along the lateral width direction.

(9) In the embodiment described above, an example is described in which the travel members are the ceiling or ceiling transport vehicles V. The travel members are not limited to such arrangement. For example, the travel member may be a travel vehicle that extends between and over a pair of rails R and that has a portion located at a lower position than the rails R. In addition, in the embodiment described above, each travel member is a ceiling or ceiling transport vehicle V configured to transport a container B and to transfer the container B to or from interareal conveyors Y. However, instead of one for transporting articles, such as containers B, a travel member may be a transporting member that is configured to transport, for example, a mobile camera for monitoring the facility or an object other than an article (for example, a person etc.) so long as the travel member is configured to travel along one or more rails R and has a below-rail portion regardless of its use and structure.

(10) In the embodiment described above, an example is described in which the support plates 21 are members having a shape of a flat plate without vertical through holes other than the screw or threaded holes. However, through holes other than the screw holes may be formed in the support plates 21. In addition, each support plate 21 may, for example, have a plurality of through holes arranged in rows, such as a punching metal, or may have through holes in a form of slits. Furthermore, rod-shaped members each of which extends along a direction along the transporting path, or rod-shaped members each of which extends along the lateral width direction may be placed next to one another in a direction perpendicular to the direction each rod-shaped member extends. And adjacent rod-shaped members may be then connected to each other to be used as the support plate 21.

(11) In the embodiment described above, an example is described in which an opening 20G is continuously formed in the upper portion of each housing S along its transporting path. However, two or more openings 20G may be formed in the upper portion of the housing S along the transporting path such that the openings 20G are space apart from each other along the transporting path. Also, since the transport mechanism is a travel carriage D in the embodiment described above, the accommodating space can be accessed through the opening 20G. However, when the transport mechanism is, for example, a roller conveyor or a belt conveyor, the rollers or the conveyor belt may be arranged to extend over the entire width of the opening 20G along the lateral width direction in plan view so that the accommodating space cannot be accessed through the opening 20G. Note that, when the transport mechanism is a roller conveyor or a belt conveyor, it is not necessary to provide end-portion-closing portions.

Summary of Embodiments Described Above

A brief summary of a facility for storing and transporting containers for semiconductor devices described above is provided next.

An article transport device in accordance with the present invention for solving the problem described above comprises: a transport mechanism which is configured to support, from below, a container being transported and to transport the container along a transporting path; a housing which forms an accommodating space in which at least a part of the transport mechanism is housed; wherein the housing has one or more support plates, a plurality of brackets, and a housing panel, wherein each of the one or more support plates is a plate-shaped member with the one or more support plates arranged to extend along the transporting path and configured to support the transport mechanism from below, wherein, with a lateral width direction defined as a direction perpendicular to a direction along the transporting path as seen along a vertical direction, a lower end portion of each of the plurality of brackets is attached to a corresponding one of the one or more support plates such that the plurality of the brackets are spaced apart from one another along a direction along the transporting path, outside the accommodating space along the lateral width direction, wherein the housing panel is capable of being attached to and detached from at least one of the plurality of brackets, wherein, when the housing panel is not attached to the at least one of the plurality of brackets, the housing is provided with a communicating opening for allowing communication between a space inside and a space outside the accommodating space, and wherein a vertical dimension of the communicating opening is set to be a dimension that corresponds to a vertical dimension of the at least one of the plurality of brackets.

In other words, the housing has one or more support plates, a plurality of brackets, and a housing panel. And the one or more support plates (each of which is a plate-shaped member extending along the transporting path) are configured to support the transport mechanism from below. The bracket or brackets support a peripheral portion, especially the housing panel which forms at least a part of a side portion of the housing, other than the support plate which forms the bottom portion of the housing. Note that the one or more support plates in its entirety may be formed of a single flat plate portion, or may have a single through hole or multiple through holes that extend through the thickness of the one or more support plates.

Since a lower end portion of each of the plurality of brackets is attached to a corresponding one of the one or more support plates such that the plurality of the brackets are spaced apart from one another along a direction along the transporting path, at least one area is formed between the brackets located along the direction along the transporting path in which no bracket is located.

Therefore, by removing the housing panel which forms at least a part of a side portion of the housing from at least one of the brackets, a communicating opening that corresponds to the area in which no bracket is located is formed in the side portion of a housing. This communicating opening has a vertical dimension that corresponds to the vertical dimension of the at least one of the plurality of brackets and has a dimension along the direction along the transporting path that corresponds to the distance between the two adjacent brackets.

Therefore, when a worker performs maintenance work on the transport mechanism, the worker can insert a hand into the accommodating space through the communicating opening by removing the housing panel from the at least one of the brackets.

On the other hand, since the one or more support plates and the plurality of brackets serve as reinforcing members for the housing, the housing can be formed without the frame members that are long along the transporting path and spaced apart from each other vertically. Thus, even when a communicating opening with a sufficient vertical dimension for a worker to insert a hand through is formed, the vertical dimension of the housing can be kept from becoming large.

As such, with the arrangement described above, an article transport device can be provided whose vertical dimension can be made small and which allows maintenance work to be performed properly from its side.

In the article transport device in accordance with the present invention, the transport mechanism preferably has a support member which is configured to support, from below, a container being transported and is configured to be moved along the transporting path, wherein an opening is preferably formed along the transporting path in an upper portion of the housing, and wherein at least a part of the support member preferably projects upward through the opening.

When an opening is formed along the transporting path in an upper portion of the housing, it is common to perform maintenance work on the transport mechanism through this opening. However, for example, in the case where there is a travel member which travels along the travel path that is defined above the article transport device, there is a possibility that the travel member may interfere with a worker when the worker is above the upper end of the housing. Thus, there may be situations in which it is impossible to perform maintenance work on the article transport device when the worker is positioned above the housing.

With the arrangement described above, even in the situation above, the worker can insert a hand into the accommodating space from the side of the housing; thus, the worker can perform maintenance work on the article transport device while positioned below the upper end of the housing.

In the article transport device in accordance with the present invention, the one or more support plates are preferably supported from below by a plurality of housing support portions each of which has an elongate shape, each of the plurality of housing support portions is preferably oriented such that longitudinal direction thereof is along the lateral width direction, and wherein the plurality of housing support portions are preferably located in spaced-apart relation at positions that correspond to positions of the plurality of brackets along the direction along the transporting path.

For example, suspending members may be attached to housing panels on side surfaces of the housing at positions that are spaced apart from one another along the direction along the travel path to support the housing at a set height by means of the suspending members. However, with this arrangement, the housing panel may bend at the attaching positions of the suspending member. An attempt to avoid such a situation would require some structure to enforce the housing, for example, by providing the housing with frame members that are long along the transporting path.

With the arrangement described above, because the plurality of housing support portions support the one or more support plates from below, bending of the housing panel is difficult to occur so that the housing can be supported at a set height with the outer shape of the housing is maintained in its original shape.

In addition, the plurality of housing support portions are located at positions that correspond to positions of the plurality of brackets along the direction along the transporting path. That is, the plurality of housing support portions support the one or more support plates from below at positions at which the one or more support plates are reinforced with the plurality of brackets; thus, the one or more support plates can be supported properly while reducing deformation of the one or more support plates each of which is plate-shaped.

In the article transport device in accordance with the present invention, the transport mechanism preferably has a travel member configured to travel along the transporting path and through the accommodating space, wherein the housing preferably includes an end-portion-closing portion at an end portion, along the direction along the transporting path, of the accommodating space, and wherein the end-portion-closing portion is preferably capable of being in either an opening state for leaving the end portion open so that the travel member can be moved through the end portion and a closing state for closing the end portion.

That is, by switching or placing the end-portion-closing portion to the opening state (i.e., by removing the end-portion-closing portion), the travel member located within the accommodating space can be taken out through the end portion of the housing to the outside of the housing. This makes it easier to perform maintenance work on the transport mechanism.

The article transport device in accordance with the present invention preferably further comprises: a casing which houses a controller for controlling the transport mechanism; wherein the casing is preferably located (a) within a range, along the direction along the transporting path, in which the housing extends, (b) to one side of the housing along the lateral width direction, and (c) at a position at which the casing does not overlap with the housing as seen along the lateral width direction.

That is, when installing the casing (which houses the controller) on one side, along the lateral width direction, of the housing, the casing would be in the way of a hand which makes it difficult to insert the hand into the accommodating space from the side of the housing, if the casing is placed at the position at which the casing overlaps with the housing as seen along the lateral width direction. With the arrangement described above, the casing is located at a position at which the casing does not overlap with the housing as seen along the lateral width direction so that the space on one side of the housing is open. This makes it easier for the worker to remove the housing panel from the side of the housing and to insert a hand into the accommodating space through the side of the housing.

An article transport facility including the article transport device in accordance with the present invention for solving the problem described above preferably comprises: a first article transport device which is the article transport device as claimed in claim 5, and a second article transport device which is another article transport device as claimed in claim 5; wherein a transporting path of the first article transport device and a transporting path of the second article transport device are preferably arranged to be linear, parallel to each other, located at a same vertical height, and adjacent each other, wherein preferably provided as casings are a first casing which houses a controller for the first article transport device, and a second casing which houses a controller for the second article transport device, wherein each of the first article transport device and the second article transport device preferably has an overlapping portion, and a non-overlapping portion along a direction along the corresponding transporting path, wherein a location of the first casing along the direction along the corresponding transporting path is preferably in a range in which the non-overlapping portion of the first article transport device extends and wherein a location of the second casing along the direction along the corresponding transporting path is preferably in a range in which the non-overlapping portion of the second article transport device extends.

In other words, even when the transporting path of the first article transport device and the transporting path of the second article transport device are arranged to be linear, parallel to each other, located at a same vertical height, and adjacent each other, maintenance work can be performed from a side of the housing of each of the first article transport device and the second article transport device.

The article transport facility in accordance with the present invention preferably comprises the article transport as defined above; and a travel member configured to travel along a rail provided above the transporting path; wherein the travel member preferably has a below-rail portion which is located below the rail, wherein the rail preferably has a crossing portion which crosses the transporting path as seen along the vertical direction, and wherein the rail is preferably so located that, in the crossing portion, a distance between an lower end of a trajectory of the below-rail portion of the travel member that travels along the rail and an upper end of the article transport device is less than or equal to a set distance.

In other words, the rail is so located that, in the crossing portion, the distance between the lower end of the trajectory of the below-rail portion of the travel member that travels along the rail provided above the transporting path of the article transport device and the upper end of the article transport device is less than or equal to a set distance; thus, the vertical space in the article transport facility can be used effectively.

With the arrangement described above, since the upper end of the article transport device and the lower end of the trajectory of the below-rail portion of the travel member are close to each other, there is a possibility that the travel member may interfere with a worker when the worker attempts to perform maintenance work on the article transport device from a position above the housing of the article transport device. Thus, when the worker performs maintenance work on the article transport device from a position above the housing of the article transport device, the operation of the travel member needs to be suspended for the duration of the maintenance work.

With the arrangement described above, since the maintenance work on the article transport device can be performed from a side of the housing, the worker can perform maintenance work without having to position herself/himself above the housing of the article transport device. Thus, there is no need to suspend the operation of the travel member when performing maintenance work on the article transport device.

Thus, an article transport facility can be provided which can reduce any decline in the operation efficiency of the travel member which travels along the rail provided above the transporting path of the article transport device, while making effective use of the vertical space in the facility.

What is claimed is:

1. An article transport device comprising:
a transport mechanism which is configured to support, from below, a container being transported and to transport the container along a transporting path; and
a housing which forms an accommodating space in which at least a part of the transport mechanism is housed;
wherein the housing has one or more support plates, a plurality of brackets, and a housing panel,
wherein each of the one or more support plates is a plate-shaped member with the one or more support plates arranged to extend along the transporting path and configured to support the transport mechanism from below,
wherein, with a lateral width direction defined as a direction perpendicular to a direction along the transporting path as seen along a vertical direction, a lower end portion of each of the plurality of brackets is attached to a corresponding one of the one or more support plates such that the plurality of brackets are spaced apart from one another along a direction along the transporting path, outside the accommodating space along the lateral width direction,
wherein the housing panel is capable of being attached to and detached from at least one of the plurality of brackets,
wherein, when the housing panel is not attached to the at least one of the plurality of brackets, the housing is provided with a communicating opening for allowing communication between a space inside and a space outside the accommodating space, and
wherein a vertical dimension of the communicating opening is set to be a dimension that corresponds to a vertical dimension of the at least one of the plurality of brackets.

2. The article transport device as defined in claim 1, wherein the transport mechanism has a support member which is configured to support, from below, a container being transported and is configured to be moved along the transporting path, and
wherein an opening is formed along the transporting path in an upper portion of the housing, and wherein at least a part of the support member projects upward through the opening.

3. The article transport device as defined in claim 1, wherein the one or more support plates are supported from below by a plurality of housing support portions each of which has an elongate shape, each of the plurality of housing support portions is oriented such that longitudinal direction thereof is along the lateral width direction, and
wherein the plurality of housing support portions are located in spaced-apart relation at positions that correspond to positions of the plurality of brackets along the direction along the transporting path.

4. The article transport device as defined in claim 1, wherein the transport mechanism has a travel member configured to travel along the transporting path and through the accommodating space,
wherein the housing includes an end-portion-closing portion at an end portion, along the direction along the transporting path, of the accommodating space, and
wherein the end-portion-closing portion is capable of being in either an opening state for leaving the end portion open so that the travel member can be moved through the end portion and a closing state for closing the end portion.

5. The article transport device as defined in claim 1, further comprising:
a casing which houses a controller for controlling the transport mechanism; and
wherein the casing is located (a) within a range, along the direction along the transporting path, in which the housing extends, (b) to one side of the housing along the lateral width direction, and (c) at a position at which the casing does not overlap with the housing as seen along the lateral width direction.

6. An article transport facility comprises:
a first article transport device which is the article transport device as claimed in claim 5, and a second article transport device which is another article transport device as claimed in claim 5;
wherein a transporting path of the first article transport device and a transporting path of the second article transport device are arranged to be linear, parallel to each other, located at a same vertical height, and adjacent each other,
wherein provided as casings are a first casing which houses a controller for the first article transport device, and a second casing which houses a controller for the second article transport device,
wherein each of the first article transport device and the second article transport device has an overlapping portion, and a non-overlapping portion along a direction along the corresponding transporting path,
wherein a location of the first casing along the direction along the corresponding transporting path is in a range in which the non-overlapping portion of the first article transport device extends and
wherein a location of the second casing along the direction along the corresponding transporting path is in a range in which the non-overlapping portion of the second article transport device extends.

7. An article transport facility comprises:
the article transport device as defined in claim 1;
a travel member configured to travel along a rail provided above the transporting path;
wherein the travel member has a below-rail portion which is located below the rail,
wherein the rail has a crossing portion which crosses the transporting path as seen along the vertical direction, and
wherein the rail is so located that, in the crossing portion, a distance between an lower end of a trajectory of the below-rail portion of the travel member that travels along the rail and an upper end of the article transport device is less than or equal to a set distance.

8. The article transport device as defined in claim 1, wherein:
the transport mechanism has a support member configured to travel along the transporting path, and
the support member supports, from below, an article being transported so as to locate the article above the housing.

9. The article transport device as defined in claim 1, wherein the support plate is suspended and supported from a ceiling.

10. The article transport device as defined in claim 1, wherein:
an opening is formed along the transporting path in an upper portion of the housing,
the transport mechanism has a support member which is configured to support, from below, an article being transported and is configured to be moved along the transporting path, and
the transport mechanism raises the support member to a raised position at which the upper end of the support member is higher than an upper end of the opening and lowers the support member to a lowered position at which the upper end of the support member is lower than the upper end of the opening.

11. The article transport device as defined in claim 1, wherein the housing has a top surface plate which is configured to support, from below, an article.

12. The article transport device as defined in claim 1, wherein the width of the housing in the lateral width direction is smaller than a width of an article being transported in the lateral width direction.

\* \* \* \* \*